(12) United States Patent
Alam (10) Patent No.: US 12,142,309 B2
(45) Date of Patent: Nov. 12, 2024

(54) LOW RESISTANCE MTJ ANTIFUSE CIRCUITRY DESIGNS AND METHODS OF OPERATION

(71) Applicant: Everspin Technologies, Inc., Chandler, AZ (US)

(72) Inventor: Syed M. Alam, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 201 days.

(21) Appl. No.: 17/847,265

(22) Filed: Jun. 23, 2022

(65) Prior Publication Data

US 2023/0267982 A1    Aug. 24, 2023

Related U.S. Application Data

(60) Provisional application No. 63/313,419, filed on Feb. 24, 2022.

(51) Int. Cl.
| | | |
|---|---|---|
| *G11C 11/00* | (2006.01) | |
| *G11C 11/16* | (2006.01) | |
| *H01L 23/525* | (2006.01) | |
| *H10N 50/10* | (2023.01) | |
| *H10N 50/80* | (2023.01) | |

(52) U.S. Cl.
CPC ...... *G11C 11/1695* (2013.01); *G11C 11/1657* (2013.01); *G11C 11/1673* (2013.01); *G11C 11/1675* (2013.01); *H01L 23/5252* (2013.01); *H10N 50/10* (2023.02); *H10N 50/80* (2023.02)

(58) Field of Classification Search
CPC ............ G11C 11/1695; G11C 11/1657; G11C 11/1673; G11C 11/1675; H10N 50/80; H10N 50/10; H01L 23/5252
See application file for complete search history.

(56) References Cited

U.S. PATENT DOCUMENTS

| | | | | |
|---|---|---|---|---|
| 7,224,630 | B2 | 5/2007 | Andre et al. | |
| 7,405,966 | B2* | 7/2008 | Seyyedy | G11C 11/15 |
| | | | | 257/E27.005 |
| 7,532,533 | B2 | 5/2009 | Andre et al. | |
| 7,687,883 | B2* | 3/2010 | Fifield | H01L 23/5252 |
| | | | | 438/467 |
| 7,894,248 | B2* | 2/2011 | Yu | G11C 11/161 |
| | | | | 365/158 |
| 8,456,897 | B2* | 6/2013 | Ranjan | G11C 11/1673 |
| | | | | 365/158 |
| 8,482,972 | B2* | 7/2013 | Chung | H10B 61/10 |
| | | | | 365/175 |

(Continued)

OTHER PUBLICATIONS

Extended European Search Report issued on Jul. 7, 2023 in European Patent Application No. 22190261.2 (9 pages, in English).

*Primary Examiner* — Viet Q Nguyen
(74) *Attorney, Agent, or Firm* — Bookoff McAndrews, PLLC (57) ABSTRACT

The present disclosure is drawn to, among other things, an antifuse circuit. The antifuse circuit includes a plurality of antifuse bitcells and a reference resistor. Each antifuse bitcell includes two or more memory bits and a reference resistor. The two or more memory bits are configured to be in a programmed state and at least one unprogrammed state.

20 Claims, 4 Drawing Sheets

(56) References Cited

U.S. PATENT DOCUMENTS

| | | | | |
|---|---|---|---|---|
| 8,547,736 | B2* | 10/2013 | Rao | G11C 11/16 |
| | | | | 365/158 |
| 8,681,573 | B2* | 3/2014 | Hafez | G11C 17/16 |
| | | | | 365/185.23 |
| 8,797,792 | B2* | 8/2014 | Rao | G11C 11/1673 |
| | | | | 365/158 |
| 9,401,385 | B2* | 7/2016 | Seo | G11C 11/1675 |
| 9,536,621 | B2* | 1/2017 | Takizawa | G11C 29/70 |
| 10,311,280 | B2* | 6/2019 | Kyusojin | G06V 20/69 |
| 10,431,278 | B2* | 10/2019 | Li | G11C 5/147 |
| 10,699,764 | B1* | 6/2020 | Roy | G11C 11/1659 |
| 10,984,878 | B1* | 4/2021 | Chang | G11C 11/5642 |
| 11,488,641 | B2* | 11/2022 | Antonyan | G11C 29/50008 |
| 11,521,692 | B2* | 12/2022 | Choy | G11C 11/1673 |
| 2014/0340958 | A1 | 11/2014 | Gharia | |
| 2019/0180173 | A1* | 6/2019 | Torng | G11C 11/1673 |
| 2022/0336000 | A1* | 10/2022 | Kim | G11C 29/021 |

* cited by examiner

LOW RESISTANCE MTJ ANTIFUSE CIRCUITRY DESIGNS AND METHODS OF OPERATION

CROSS-REFERENCE TO RELATED APPLICATION

This application claims benefit to U.S. Provisional Patent Application No. 63/313,419, filed Feb. 24, 2022, the entire content of which is incorporated herein by reference.

TECHNICAL FIELD

The present disclosure relates to magnetoresistive tunnel junction ("MTJ") devices and related methods, including magnetoresistive tunnel junction antifuse circuitry designs and devices and related methods of operation.

INTRODUCTION

In magnetoresistive tunnel junction ("MTJ") antifuse circuitry designs, a reference resistor is used to sense the state of the MTJ. The possible states of the MTJ are programmed (e.g., resistance less than or equal to approximately 500 Ohms due to MTJ breakdown), unprogrammed low state (e.g., MTJ resistance range in low state), and unprogrammed high state (e.g., MTJ resistance range in high state). Here, program operation refers to breaking down the MTJ through any means, for example, where the low resistance state after programming is permanent, i.e., the MTJ resistance does not change after programming. The reference resistor value may be set between the programmed state and unprogrammed low state (MTJ resistance in low state) for a maximum read signal. If a large diameter MTJ or low resistance area ("RA") product MTJ is used, then the window between programmed state and unprogrammed low state may be too small to place a reference resistor for a high yield sensing operation.

There are many inventions described and illustrated herein, as well as many aspects and embodiments of those inventions. When large diameter MTJ or low resistance area ("RA") product MTJ is used, then the window between the programmed state and the unprogrammed low state may be too small to place a reference resistor (i.e., reference resistor 18) for a high yield sensing operation. Hence, a design approach is needed to increase the sensing window for low resistance MTJ antifuse read. The approach may be desirable for large technology nodes where large MTJ diameters are used.

Additionally, aspects of the present disclosure may be combined, arranged, or otherwise integrated with aspects of any previous Everspin disclosure, such as, for example, U.S. Pat. Nos. 7,224,630, and 7,532,533, which are incorporated by reference in their entireties.

SUMMARY

Various aspects discussed herein may include an antifuse circuit. The antifuse circuit may include a plurality of antifuse bitcells and a reference resistor. Each antifuse bitcell may include two or more memory bits and a reference resistor. The two or more memory bits may be configured to be in a programmed state and at least one unprogrammed state.

The antifuse circuit may include one or more of the following aspects. Each memory bit of the two or more memory bits may be a magnetoresistive tunnel junction. The two or more magnetoresistive tunnel junctions may be connected through multiplexer circuitry. The antifuse circuit may further include a pull-up program circuit, a pull-down program circuit, and two or more wordlines. The two or more wordlines may be configured to selectively couple the pull-up program circuit or the pull-down program circuit to one or more of the plurality of antifuse bitcells or the reference resistor. The antifuse circuit may further include a PMOS or a NMOS. The antifuse circuit may further include a transfer gate. The at least one unprogrammed state may include a low unprogrammed state and a high unprogrammed state. Each antifuse bitcell may include a resistance of approximately 500 Ohms in the programmed state, a resistance between approximately 1,800 Ohms to approximately 5,000 Ohms in the low unprogrammed state, and a resistance between approximately 3,500 Ohms and approximately 10,000 Ohms in the high unprogrammed state. The reference resistor may include a resistance between approximately 1,000 Ohms and approximately 3,500 Ohms.

In another aspect, a method of operating an antifuse circuit, which may include a plurality of antifuse bitcells, may include performing a read operation of one or more of the plurality of antifuse bitcells. Each antifuse bitcell may include at least one memory bit and a reference resistor. The at least one memory bit may be configured to be in a programmed state, a low unprogrammed state, and a high unprogrammed state.

The method of operating an antifuse circuit may include one or more of the following aspects. Each of the at least one memory bit may be a magnetoresistive tunnel junction. Each antifuse bitcell may include two magnetoresistive tunnel junctions. Each antifuse bitcell includes a PMOS or a NMOS. The antifuse circuit may include a pull-up program circuit, a pull-down program circuit, and two or more wordlines. The two or more wordlines may be configured to selectively couple the pull-up program circuit or the pull-down program circuit to one or more of the plurality of antifuse bitcells or the reference resistor. The method may further include writing the one or more of the plurality of antifuse bitcells to a high state immediately before performing the read operation. The high state may include a resistance range between approximately 3,500 Ohms and approximately 10,000 Ohms. The programmed state may include a resistance of approximately 500 Ohms, and the reference resistor may include a resistance between approximately 500 Ohms and approximately 3,500 Ohm.

In yet another aspect, an antifuse circuit may include a plurality of antifuse bitcells and a reference resistor. Each antifuse bitcell may include two or more memory bits and a reference resistor. The two or more memory bits may be configured to be in a programmed state and at least one unprogrammed state. The at least one unprogrammed state may include a low unprogrammed state and a high unprogrammed state The antifuse circuit may include one or more of the following aspects. Each antifuse bitcell may include a resistance of approximately 500 Ohms in the programmed state, a resistance between approximately 1,800 Ohms to approximately 5,000 Ohms in the low unprogrammed state, and a resistance between approximately 3,500 Ohms and approximately 10,000 Ohms in the high unprogrammed state. The reference resistor may include a resistance between approximately 1,000 Ohms and approximately 3,500 Ohms. The two or more memory bits may be magnetoresistive tunnel junctions. The antifuse circuit may include a pull-up program circuit, a pull-down program circuit, and two or more wordlines. The two or more wordlines may be configured to selectively couple the pull-up program circuit or the pull-down program circuit to one or more of the plurality of antifuse bitcells or the reference resistor. The antifuse circuit may further include a PMOS or a NMOS.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Moreover, while certain regions/layers and features are illustrated with straight 90-degree edges, in actuality or practice such regions/layers may be more "rounded" and/or gradually sloping.

It should be noted that, even if it is not specifically mentioned, aspects described with reference to one embodiment may also be applicable to, and may be used with, other embodiments. Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate that the embodiment(s) is/are "example" embodiment(s).

Again, there are many embodiments described and illustrated herein. The present disclosure is not limited to any single aspect or embodiment thereof, nor is it limited to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

The present disclosure generally relates to magnetoresistive devices having a magnetoresistive stack or structure (for example, part of a magnetoresistive memory device, magnetoresistive sensor/transducer device, etc.) and methods of operating the described magnetoresistive devices. For example, present embodiments describe low resistance MTJ antifuse circuitry designs, and methods of operating the MTJ antifuse devices.

It should be noted that all numeric values disclosed herein (including all disclosed thickness values, limits, and ranges) may have a variation of ±10% (unless a different variation is specified) from the disclosed numeric value. For example, a resistance disclosed as being "r" units in resistance can vary in resistance from (r−0.1r) to (r+0.1r) units. Further, all relative terms such as "about," "substantially," "approximately," etc. are used to indicate a possible variation of ±10% (unless noted otherwise or another variation is specified). Moreover, in the claims, values, limits, and/or ranges of thickness and atomic composition of, for example, the described layers/regions, mean the value, limit, and/or range ±10%. It should be noted that the exemplary resistance values discussed in this disclosure are expected values (i.e., not measured values) of resistances. As a person of ordinary skill in the art would recognize, these resistance values may change after further processing (e.g., exposure to high temperatures, etc.) or the elapsing of time.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device or method. Further, the terms "first," "second," and the like, herein do not denote any order, quantity, or importance, but rather are used to distinguish one element from another. Similarly, terms of relative orientation, such as "top," "bottom," "adjacent," "next to," etc. are used with reference to the orientation of the structure illustrated in the figures being described. Moreover, the terms "a" and "an" herein do not denote a limitation of quantity, but rather denote the presence of at least one of the referenced item.

For the sake of brevity, conventional techniques related to semiconductor processing may not be described in detail herein. The exemplary embodiments may be fabricated using any suitable now-known or future-developed processes, such as known lithographic processes. The fabrication of integrated circuits, microelectronic devices, micro electro mechanical devices, microfluidic devices, and photonic devices involves the creation of several layers or regions (e.g., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials.

The patterns that define particular regions of devices according to the present disclosure are often created by lithographic processes. For example, a layer of photoresist may be applied onto a layer overlying a wafer substrate. A photo mask (containing clear and opaque areas) may be used to selectively expose the photoresist by a form of radiation, such as ultraviolet light, electrons, or x-rays. Either the photoresist exposed to the radiation, or not exposed to the radiation, may be removed by the application of a developer. An etch may then be employed/applied whereby the layer (or material) not protected by the remaining resist is patterned. Alternatively, an additive process can be used in which a structure is built up using the photoresist as a template.

Magnetoresistive devices of the current disclosure may include magnetic tunnel junction bits (MTJ bits). The MTJ bits may be formed from a magnetoresistive stack/structure that may include, or may be operably coupled to, one or more electrically conductive electrodes, vias, or conductors on either side of the magnetoresistive stack/structure. The magnetoresistive stack/structure that forms the MTJ bits may include many different regions and/or layers of material, where some of the regions and/or layers include magnetic materials, and whereas other regions and/or layers do not. In at least one embodiment, methods of manufacturing the disclosed devices may include sequentially depositing, growing, sputtering, evaporating, and/or providing (collectively referred herein as "depositing" or other verb tense (e.g., "deposit" or "deposited")) layers and regions which, after further processing (for example, etching), form an MTJ bit (or a plurality of MTJ bits stacked one on top of another or arranged in an array).

As is known in the art, an electrical resistance of the described MTJ bits may change based on whether the magnetization direction (e.g., the direction of the magnetic moment) of a free region adjacent to a non-magnetic layer (e.g., a dielectric layer serving as a tunnel barrier) is in a parallel alignment or in an antiparallel alignment with the magnetization direction (e.g., the direction of the magnetic moment) of a fixed region adjacent to the non-magnetic layer. Typically, if the two regions have the same magnetization alignment, the resulting relatively low resistance is considered as a digital "0," while, if the alignment is antiparallel, the resulting relatively higher resistance is considered to be a digital "1." A memory device (such as an MRAM) may include multiple such MTJ bits, which may be referred to as memory cells or elements, arranged in an array of columns and rows. By measuring the current through each cell, the resistance of each cell, and thus the data stored in the memory array, can be read.

Figure 1:
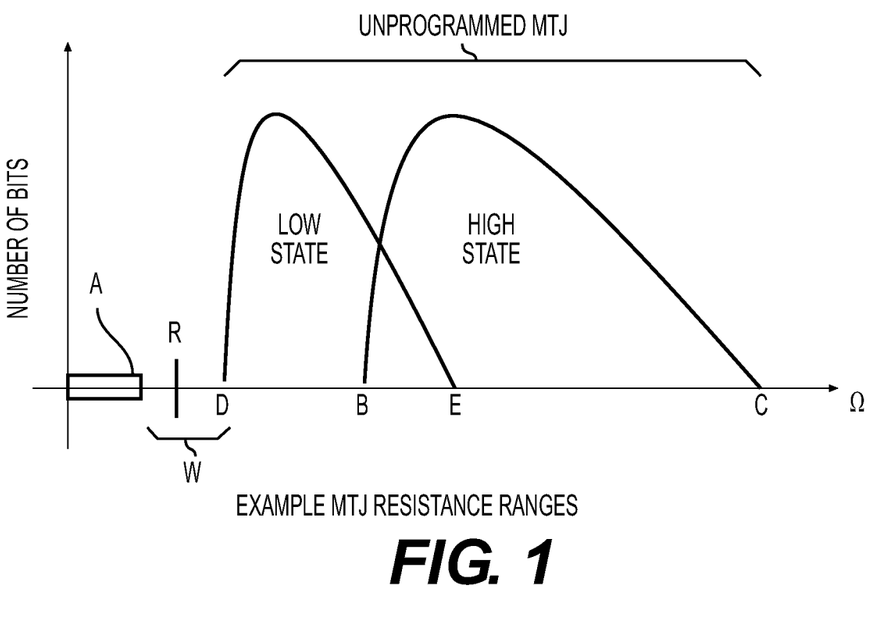
FIG. 1 illustrates a graph of resistance distributions for a population of MTJs.

FIG. 1 illustrates exemplary resistance ranges for a programmed MTJ, an unprogrammed MTJ in a low state, and an unprogrammed MTJ in a high state. A programmed MTJ resistance is usually less than or equal to a first resistance A, for example, approximately 500 Ohms or less for a range of MTJ diameter or RA products. The MTJ High state resistance may be between a first high state resistance B, for example, approximately 3,500 Ohms, and a second high state resistance C, for example, approximately 10,000 Ohms, for example, depending on various MTJ parameters. However, MTJ Low state resistance can be significantly reduced with larger diameter MTJ and/or low RA products between a first low state resistance D, for example, approximately 1,800 Ohms, and a second low state resistance E, for example, approximately 5,000 Ohms. First low state resistance D may be lower than first high state resistance B. Second low state resistance E may be less than second high state resistance C, for example, between first high state resistance B and second high state resistance C. A reference resistor may be included as well. The reference resistor may include a reference resistance R, for example, the reference resistor may include reference resistance R of, for example, approximately 1,000 Ohms resistor. FIG. 1 also illustrates a sensing window W for an antifuse read between a resistance of the programmed MTJ, for example, first resistance A, and a resistance of a low end of the unprogrammed MTJ in a Low state, for example, first low state resistance D.

Figure 2:
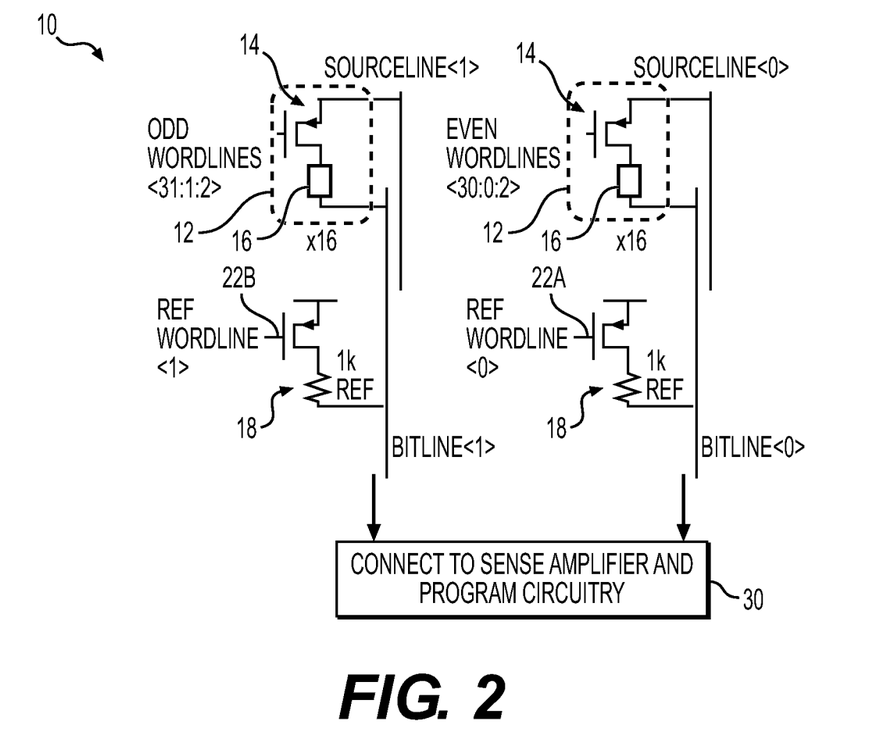
FIG. 2 illustrates circuitry with antifuse bitcell with a single MTJ.

FIG. 2 illustrates a MTJ antifuse circuit 10, for example, a MTJ anifuse circuit array. As shown in FIG. 2, MTJ antifuse bitcells 12 often have one or more P-channel metal-oxide-semiconductors ("PMOS") 14 and one MTJ 16. The PMOS area may cover multiple MTJs 16; however, only one MTJ 16 is connected to the PMOS select device. Alternatively or additionally, the MTJ antifuse bitcells 12 may include one or more n-channel metal-oxide semiconductor ("NMOS") transistor select devices. The MTJ 16 may be arranged on one leg of the array, and a reference resistor 18 may be arranged on another leg of the array. A MTJ antifuse bitcell array often has a plurality of wordlines (not shown), e.g., 32 wordlines. Half of the wordlines may be on even bitline (i.e., bitline<0>), and the other half of the wordlines may be on odd bitline (i.e., bitline<1>). Each reference resistor 18 may include its own wordline select device 22A, 22B, for example, existing on both bitlines. A method of operation may include selecting either one of bitline<0>22A or bitline<1>22B for the reference resistor 18, while the other of bitline<0>20A or bitline<1>20B is selected for the MTJ. Thus, a single MTJ 16 may be compared against the reference resistor 18 (e.g., a 1,000 Ohms resistance resistor). Additionally, MTJ antifuse circuit 10 may include one or more connections to sense amplifier and program circuitry 30.

Figure 3:
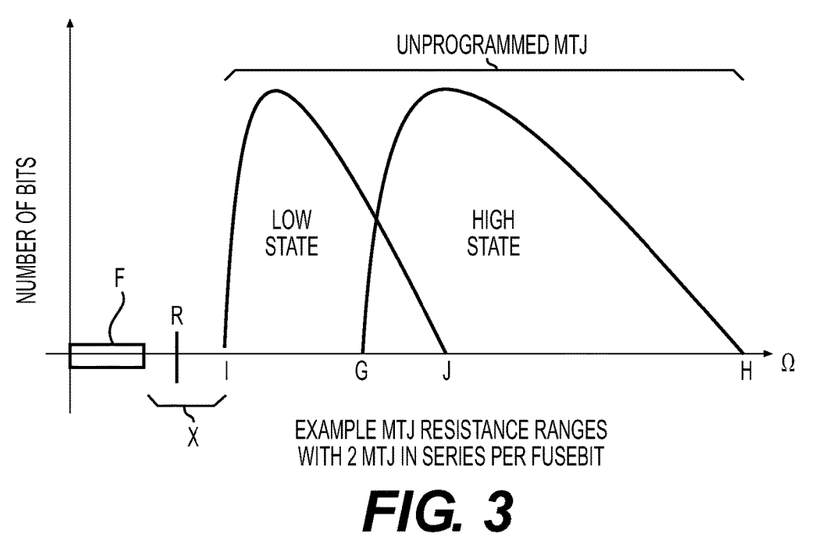
FIG. 3 illustrates a graph of resistance distributions for two MTJs arranged in series, according to one embodiment.

Various aspects of this disclosure include using at least two MTJs in series for each antifuse bit, instead of a single MTJ for each antifuse bit and comparing the single MTJ with a reference resistor. Using two MTJs in series may help to increase the sensing window for an antifuse read, as illustrated in FIG. 3.

In the example, the resistance of the MTJs in the respective configurations may be doubled. FIG. 3 illustrates exemplary resistance ranges for the two MTJs. As discussed above programmed MTJ resistance is usually less than or equal to a first resistance F, for example, approximately 1,000 Ohms or less for a range of MTJ diameter or RA products. The programmed MTJ resistance in these aspects may be twice the first resistance A, for example, with both MTJs being programmed. The MTJ High state resistance for the two MTJs may be between a first high state resistance G, for example, approximately 7,000 Ohms, and a second high state resistance H, for example, approximately 20,000 Ohms, for example, depending on various MTJ parameters. However, MTJ Low state resistance for the two MTJs may be reduced with larger diameter MTJ and/or low RA products between a first low state resistance I, for example, approximately 3,600 Ohms, and a second low state resistance J, for example, approximately 10,000 Ohms. First low state resistance I may be lower than first high state resistance G. Second low state resistance J may be less than second high state resistance H, for example, between first high state resistance G and second high state resistance H. One or more reference resistors R may be included as well. The reference resistor may include a reference resistance R, for example, the reference resistor may include reference resistance R of, for example, approximately 1,000 Ohms resistor. Additionally, FIG. 3 illustrates sensing window X for an antifuse read between a resistance of the programmed MTJ, for example, first resistance F, and a resistance of a low end of the unprogrammed MTJ in a Low state, for example, first low state resistance I.

In this example, a second sensing window X may extend the resistance of the two programmed MTJs (e.g., approximately 1,000 Ohms or less) and the low end of the two MTJs in a Low state (e.g., approximately 3,600 Ohms and higher). In this aspect, the sensing window X may extend between approximately 1,000 Ohms and approximately 3,600 Ohms, for example, for a sensing window range of 2,600 Ohms (two times larger or wider than the approximately 1,300 Ohms sensing window range of a single MTJ configuration). In this aspect, the reference resistor R may be positioned in the middle of the sensing window range, which may help to provide for a more reliable sensor measurement (allowing for easier readings, accommodating for variations or margins in the MTJs, sensor readings, etc.). Various aspects of the embodiments discussed herein may be used with older and/or larger MTJs, while also allowing for use with small or low resistances.

Figure 4:
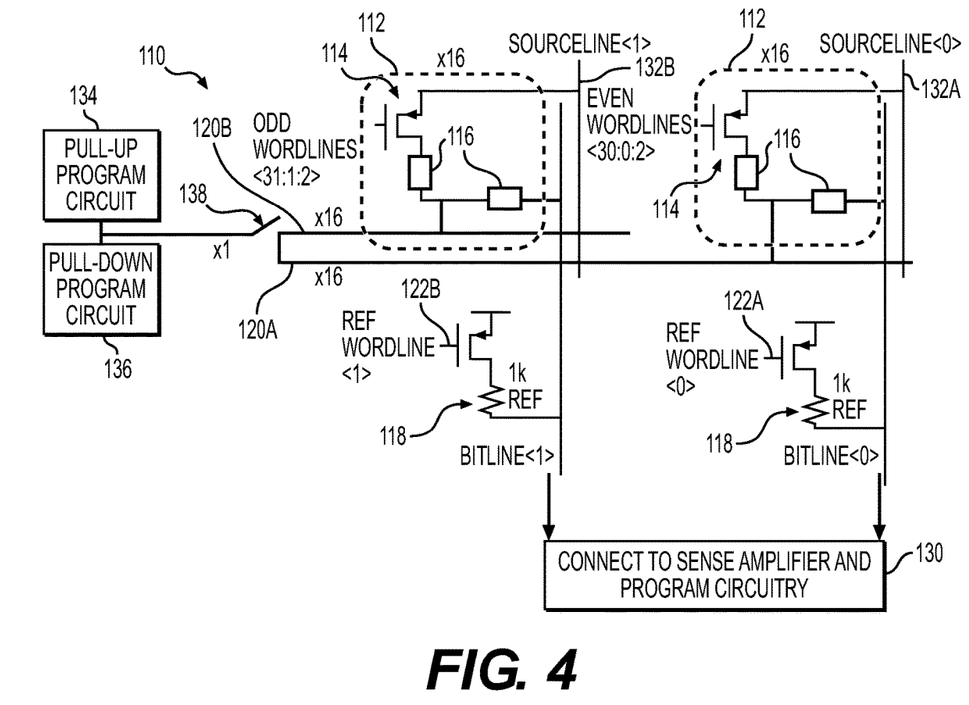
FIG. 4 illustrates an exemplary antifuse circuitry design with two MTJs per one antifuse bitcell.

FIG. 4 below illustrates an exemplary MTJ antifuse circuit 110 with two MTJs 116 per MTJ antifuse bitcell 112. The antifuse circuit 110 may include two sourcelines 132A, 132B, and may be connected to sense amplifier and program circuitry 130. Although not shown, one or more aspects discussed herein may include more than two MTJs 116 per bitcell 112. The two MTJs 116 may be arranged on one leg of the array, and a reference resistor 118 may be arranged on another leg of the array. As shown, the MTJ antifuse bitcell 112 may include one PMOS 114 (or one NMOS) and two MTJs 116 arranged in series. Furthermore, horizontal wordlines 120A, 120B may be added to the sensor array, which may allow for individual programming of the two MTJs 116, for example, via selective coupling to a pull-up program circuit 134 and/or to a pull-down program circuit 136 (i.e. via a switch 138). The arrangement of MTJ antifuse circuit 110 shown in FIG. 4 may allow for an increased sensing window (i.e., as discussed with respect to FIG. 3 above), without increasing a size of the MTJ antifuse bitcell array. For example, the PMOS (or NMOS) area may remain the same as a bitcell with a single MTJ (e.g., FIG. 1). Additionally, there may be no current sneak path in the array during one or more of programming and reading.

Although not shown in FIG. 4, another embodiment of the antifuse device with two MTJs 116 per bitcell 112 may not include program wordlines 120A, 120B. Instead, the MTJs 116 may be programmed with a high voltage on the sourcelines (i.e., sourcelines 132A, 132B). For example, a supply voltage ("VDD") of approximately 3 Volts may be applied to the sourcelines while the two MTJs 116 are arranged in series. Sufficiently high voltage on the sourcelines may program MTJs 116 in series, in this case.

Figure 5:
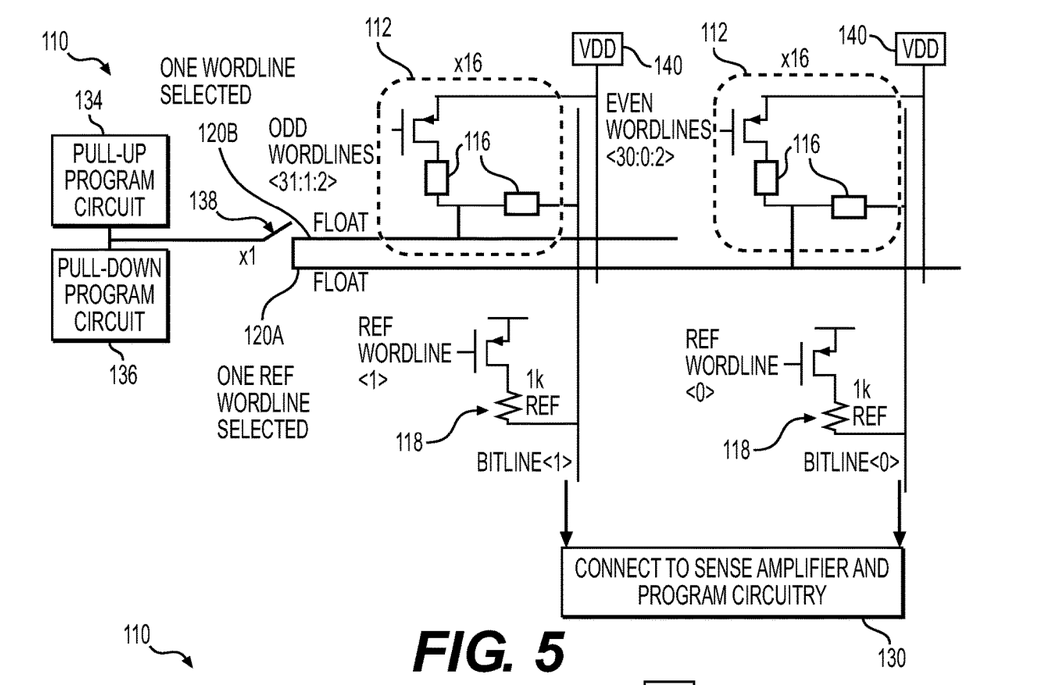
FIG. 5 illustrates exemplary circuitry in a read condition

FIG. 5 illustrates MTJ antifuse circuit 110 in a read condition. As shown, connections to pull-up program circuit 134 and to pull-down program circuit 136 (e.g., via switch 138 and horizontal wordlines 120A and 120B) may be in float (High Z or high impedance) conditions. Additionally, a bit array may include sixteen (16) bitcells 112 for even wordlines 120A, and may also include sixteen (16) bitcells 112 for odd wordlines 120B. Each of the bitcells 112 may be connected to a voltage source (e.g., VDD 140) in order for a reading to be performed to the antifuse circuit 110 with reference resistor(s) 118. Furthermore, each of the bitcells 112 may be connected to sense amplifier and program circuitry 130, as discussed above.

Figure 6:
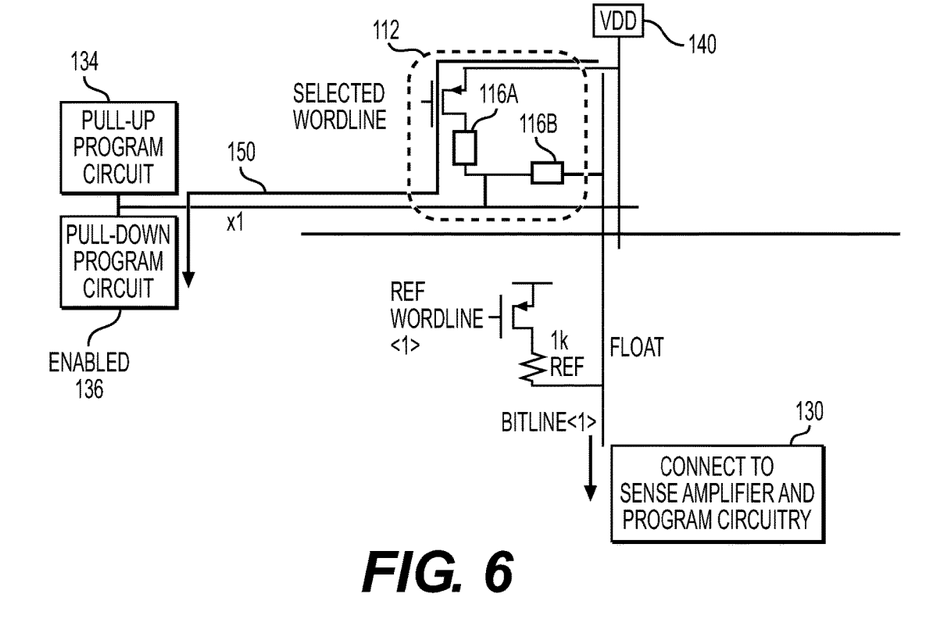
FIG. 6 illustrates exemplary circuitry in a programming condition.

FIG. 6 illustrates a portion of antifuse circuit 110, including at least one antifuse bitcell 112, in a programming condition for a first MTJ 116A. As shown, with pull-down program circuit 136 enabled (and thus pull-up program circuit 134 not enabled), current 150 may flow from a voltage source (e.g., VDD 140), through first MTJ 116A (and not through a second MTJ 116B), and to pull-down program circuit 136, in order to program first MTJ 116A. The connection(s) to sense amplifier and program circuitry 130 may be in a float (e.g. high Z or high impedance) condition.

Figure 7:
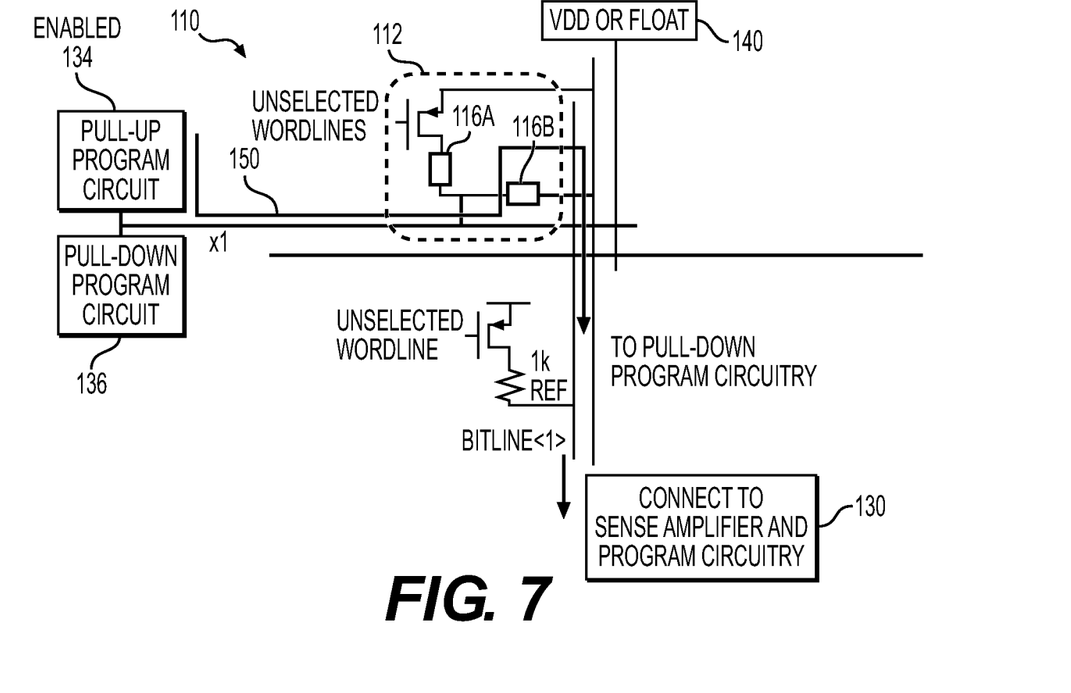
FIG. 7 illustrates exemplary circuitry in another programming condition.

FIG. 7 below illustrates a portion of antifuse circuit 110, including at least one antifuse bitcell 112, in a programming condition for second MTJ 116B. As shown, with pull-up program circuit 134 enabled (and thus pull-down program circuit 136 not enabled), current 150 may flow from pull-up program circuit 134, through second MTJ 116B (and not through first MTJ 116A), and to pull-down program circuit 136 (e.g., through connections to sense amplifier and program circuitry 130), in order to program second MTJ 116B. A connection to the voltage source (e.g., VDD 140) on the one or more sourcelines may be in either a float (e.g. high Z or high impedance) or VDD condition.

Although not shown, other embodiments of a MTJ antifuse circuitry design may include two MTJs 116 arranged in series for each antifuse bitcell 112. Each bitcell 112 may include one or more transfer gates instead of the PMOS 114 or NMOS devices discussed above. Furthermore, although not shown, the series connection of the two MTJs 116 may be formed outside of the array, for example, via multiplexer ("MUX") circuitry, such that the two MTJs 116 may be spaced apart from one another. Such embodiments may also help to allow for low resistance MTJ antifuse measurements.

Figure 8:
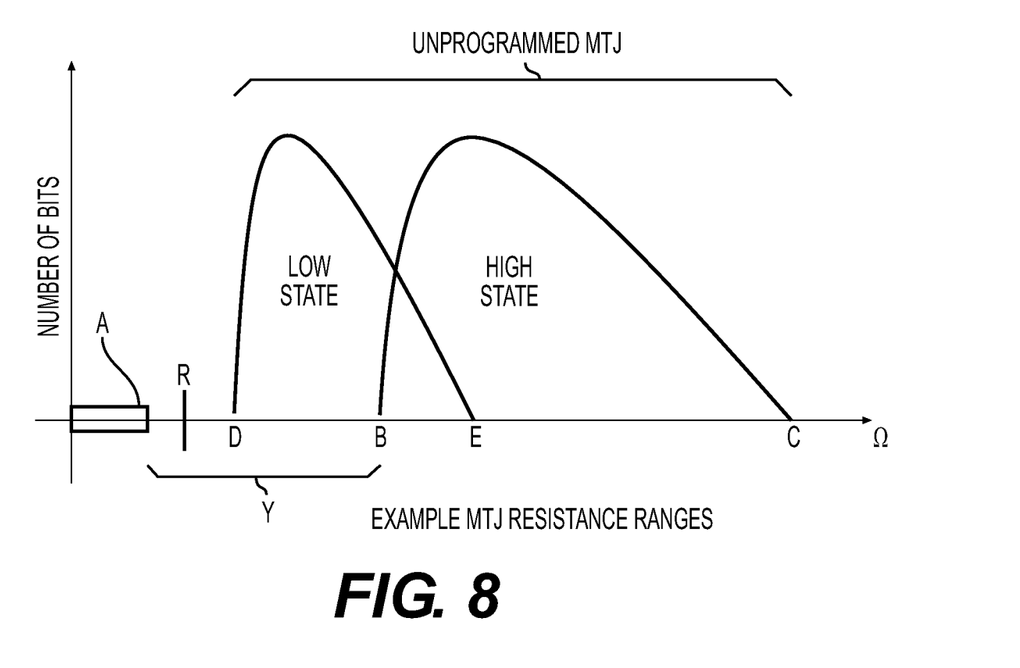
FIG. 8 illustrates a graph of resistance distributions for a single MTJ, according to another embodiment for antifuse read.

Additionally, other embodiments of a MTJ antifuse circuitry design may include a single MTJ 116 for each antifuse bitcell 112, as discussed below with respect to FIG. 8. As discussed above, MTJ 116 may include a High state with a resistance range between first high state resistance B and second high state resistance C. Additionally, MTJ 116 may also include a Low state with a resistance range between first low state resistance D and second low state resistance E. In these aspects, bitcell 112 may be written to a high state immediately before (e.g., nanoseconds, microseconds, milliseconds, centiseconds, deciseconds, seconds, or minutes before) the fuse read operation. The fuse read operation may then be performed on the antifuse bitcell 112 immediately after the write operation. In this aspect, it can be approximately ensured that MTJ 116 is in the High state, and not in a Low state. Accordingly, the sensing window Y may extend from programmed MTJ resistance A (e.g., approximately 500 Ohms) to first high state resistance B (e.g., a low end of the High state of approximately 3,500 Ohms). In some examples, sensing window Y may extend between resistances of approximately 500 Ohms and approximately 3,500 Ohms, for example, for a sensing window range of approximately 3,000 Ohms. As discussed above, the reference resistor (i.e., resistors 18, 118) with resistance R may be positioned in the middle of the sensing window range, which may help to provide for a more reliable sensor measurement (allowing for easier readings, accommodating for variations or margins in the MTJs, sensor readings, etc.). Various aspects of the embodiments discussed herein may be used with older technology node and/or larger MTJs, while also allowing for use with small or low resistances.

Various aspects discussed herein for MTJ-based antifuse circuitry designs may help to improve the reliability of the antifuse bitcells and/or provide other benefits. For example, the MTJ-based antifuse circuitry designs may require less area and may include a less complex design than laser fuse designs, poly fuse designs, metal fuse designs, etc. Additionally, various embodiments discussed herein do not require very high voltages, such as 5V or above, for programming. To the contrary, typically available input-output ("IO") voltage levels, such as approximately 1.2 Volts, approximately 1.5 Volts, and approximately 3 Volts, are sufficient for MTJ antifuse programming. Furthermore, the various features of the MTJ-based antifuse circuitry designs discussed herein may be programmed at different stages of the product development, for example, at the wafer-level probe stage, at the package testing stage, at a customer board stage, etc. At these various stages, the various features of the MTJ-based antifuse circuitry designs discussed herein may be programmed using the supply voltage of the product (i.e., the sensor or bitcell array or the product chip). Furthermore, such MTJ-based antifuse circuitry designs may be used with large technology nodes (e.g. approximately 90 nm or above), and for example, with large diameter MTJs (e.g., approximately 90 nm), with low resistances.

While principles of the present disclosure are described herein with reference to illustrative examples for particular applications, it should be understood that the disclosure is not limited thereto. For example, instead of a MTJ-based bitcell, another memory bit such as resistive RAM or Ferroelectric RAM bit technology may be used to design the antifuse circuitry with the present disclosure. Another memory bit may have a programmed state and at least one unprogrammed state. The at least one unprogrammed state may further comprise a plurality of unprogrammed states, for example, a low unprogrammed state, a high unprogrammed state, and one or more intermediate unprogrammed states. Those having ordinary skill in the art and access to the teachings provided herein will recognize additional modifications, applications, embodiments, and substitution of equivalents all fall within the scope of the features described herein. Accordingly, the claimed features are not to be considered as limited by the foregoing description.

In one embodiment, an antifuse circuit may comprise a plurality of antifuse bitcells and a reference resistor. Each antifuse bitcell may comprise two or more memory bits and a reference resistor. The two or more memory bits may be configured to be in a programmed state and at least one unprogrammed state.

Various embodiments of the antifuse circuit may include: each memory bit of the two or more memory bits may be a magnetoresistive tunnel junction; the two or more magnetoresistive tunnel junctions may be connected through multiplexer circuitry; the antifuse circuit may further include a pull-up program circuit, a pull-down program circuit, and two or more wordlines; the two or more wordlines may be configured to selectively couple the pull-up program circuit or the pull-down program circuit to one or more of the plurality of antifuse bitcells or the reference resistor; the antifuse circuit may further include a PMOS or a NMOS; the antifuse circuit may further include a transfer gate; the at least one unprogrammed state may include a low unprogrammed state and a high unprogrammed state; each antifuse bitcell may include a resistance of approximately 500 Ohms in the programmed state, a resistance between approximately 1,800 Ohms to approximately 5,000 Ohms in the low unprogrammed state, and a resistance between approximately 3,500 Ohms and approximately 10,000 Ohms in the high unprogrammed state; the reference resistor may include a resistance between approximately 1,000 Ohms and approximately 3,500 Ohms.

In another embodiment, a method of operating an antifuse circuit, which may include a plurality of antifuse bitcells, may include performing a read operation of one or more of the plurality of antifuse bitcells. Each antifuse bitcell may include at least one memory bit and a reference resistor. The at least one memory bit may be configured to be in a programmed state, a low unprogrammed state, and a high unprogrammed state.

Various embodiments of the method of operating the antifuse circuit may include: each of the at least one memory bit may be a magnetoresistive tunnel junction; each antifuse bitcell may include two magnetoresistive tunnel junctions; each antifuse bitcell includes a PMOS or a NMOS; the antifuse circuit may include a pull-up program circuit, a pull-down program circuit, and two or more wordlines; the two or more wordlines may be configured to selectively couple the pull-up program circuit or the pull-down program circuit to one or more of the plurality of antifuse bitcells or the reference resistor; the method may further include writing the one or more of the plurality of antifuse bitcells to a high state immediately before performing the read operation; the high state may include a resistance range between approximately 3,500 Ohms and approximately 10,000 Ohms; the programmed state may include a resistance of approximately 500 Ohms, and the reference resistor may include a resistance between approximately 500 Ohms and approximately 3,500 Ohm.

In yet another embodiment, an antifuse circuit may include a plurality of antifuse bitcells and a reference resistor. Each antifuse bitcell may include two or more memory bits and a reference resistor. The two or more memory bits may be configured to be in a programmed state and at least one unprogrammed state. The at least one unprogrammed state may include a low unprogrammed state and a high unprogrammed state Various embodiments of the antifuse circuit may include: each antifuse bitcell may include a resistance of approximately 500 Ohms in the programmed state, a resistance between approximately 1,800 Ohms to approximately 5,000 Ohms in the low unprogrammed state, and a resistance between approximately 3,500 Ohms and approximately 10,000 Ohms in the high unprogrammed state; the reference resistor may include a resistance between approximately 1,000 Ohms and approximately 3,500 Ohms; the two or more memory bits may be magnetoresistive tunnel junctions; the antifuse circuit may include a pull-up program circuit, a pull-down program circuit, and two or more wordlines; the two or more wordlines may be configured to selectively couple the pull-up program circuit or the pull-down program circuit to one or more of the plurality of antifuse bitcells or the reference resistor; the antifuse circuit may further include a PMOS or a NMOS.

The foregoing description of the inventions has been described for purposes of clarity and understanding. It is not intended to limit the inventions to the precise form disclosed. Various modifications may be possible within the scope and equivalence of the application.

I claim:

1. An antifuse circuit, comprising:
a plurality of magnetoresistive tunnel junction (MTJ) antifuse bitcells including a first MTJ antifuse bitcell and a second MTJ antifuse bitcell, wherein each MTJ antifuse bitcell of the plurality of MTJ antifuse bitcells includes:
an MTJ having a first electrode and a second electrode and a magnetoresistive stack/structure disposed therebetween, wherein the MTJ is configured in only one of: (i) a programmed antifuse state or (ii) unprogrammed antifuse state, wherein if the MTJ is configured in the unprogrammed antifuse state, the MTJ is configurable in an unprogrammed low state and an unprogrammed high state, and
a first select transistor electrically coupled to the first electrode of the MTJ of the associated MTJ antifuse bitcell, wherein the first select transistor includes a gate;
a first reference resistor;
a second select transistor, electrically coupled to the first reference resistor, wherein the second select transistor includes a gate;
a plurality of electrical conductors, including first and second electrical conductors, wherein the first MTJ antifuse bitcell is coupled to the first electrical conductor and the first reference resistor is coupled to the second electrical conductor;
a sense amplifier having a first input electrically coupled to the first electrical conductor and a second input electrically coupled to the second electrical conductor; and
wherein, in a first operation, (i) the first select transistor of the first MTJ antifuse bitcell is responsively enabled, via a voltage applied to the gate thereof, to electrically connect the MTJ of the first MTJ antifuse bitcell to the sense amplifier via the first electrical conductor and (ii) the second select transistor is responsively enabled, via a voltage applied to the gate thereof, to electrically connect the reference resistor to the sense amplifier via the second electrical conductor, and wherein the sense amplifier is configured to sense whether the MTJ of the first MTJ antifuse bitcell is in the programmed antifuse state or the unprogrammed antifuse state.

2. The antifuse circuit of claim 1, wherein:
the MTJ of the first MTJ antifuse bitcell is connected between the first select transistor of the first MTJ antifuse bitcell and the first electrical conductor, and
the MTJ of the second MTJ antifuse bitcell is connected between the first select transistor of the second MTJ antifuse bitcell and the second electrical conductor.

3. The antifuse circuit of claim 1, further including:
a second reference resistor coupled to the first electrical conductor; and
a third select transistor, electrically coupled to the second reference resistor, wherein the third select transistor includes a gate.

4. The antifuse circuit of claim 1, wherein:
a first terminal of the first reference resistor is connected to the second select transistor,
a second terminal of the first reference resistor is electrically connected to the second electrical conductor,
the second electrical conductor is electrically connected to the second input of the sense amplifier,
the second select transistor of the second MTJ antifuse bitcell is electrically connected to the voltage source, and
wherein, in the first operation, the second select transistor is responsively enabled, via a voltage applied to the gate thereof, to electrically connect the voltage source to the first terminal of the first reference resistor.

5. The antifuse circuit of claim 1, further including:
a second reference resistor electrically coupled to the first electrical conductor;
a third select transistor, electrically coupled to the second reference resistor, wherein the third select transistor includes a gate, wherein:
the first reference resistor is connected between the second select transistor and the second electrical conductor, and
the second reference resistor is connected between the third select transistor of the and the first electrical conductor.

6. The antifuse circuit of claim 5, wherein:
each of the second and third select transistors is a PMOS transistor,
the first reference resistor is connected between the second select transistor and the second electrical conductor, and
the second reference resistor is connected between the third select transistor of the and the first electrical conductor.

7. The antifuse circuit of claim 5, wherein, in a second operation, (i) the first select transistor of the second MTJ antifuse bitcell is responsively enabled, via a voltage applied to the gate thereof, to electrically connect the MTJ of the second MTJ antifuse bitcell to the sense amplifier via the second electrical conductor and (ii) the third select transistor is responsively enabled, via a voltage applied to the gate thereof, to electrically connect the second reference resistor to the sense amplifier via the first electrical conductor, and wherein the sense amplifier is configured to sense whether the MTJ of the second MTJ antifuse bitcell is in the programmed antifuse state or the unprogrammed antifuse state.

8. The antifuse circuit of claim 1, wherein the first transistor of each of the first and second MTJ antifuse bitcells is a PMOS transistor.

9. The antifuse circuit of claim 1, wherein:
the first transistor of each of the first and second MTJ antifuse bitcells is a PMOS transistor
the first electrode of the MTJ of the first MTJ antifuse bitcell is connected to the first select transistor of the first MTJ antifuse bitcell,
second electrode of the MTJ of the first MTJ antifuse bitcell is connected to the first electrical conductor,
the first electrical electrically conductor is connected to the first input of the sense amplifier,
the first select transistor of the first MTJ antifuse bitcell is electrically connected to a voltage source, and
wherein, in the first operation, the first select transistor is responsively enabled, via a voltage applied to the gate thereof, to electrically connect the voltage source to the first electrode of the MTJ of the first MTJ antifuse bitcell.

10. The antifuse circuit of claim 1, wherein the second select transistor is a PMOS transistor.

11. A method of determining the antifuse state of a first magnetoresistive tunnel junction (MTJ) antifuse bitcell of an antifuse circuit, wherein the first MTJ antifuse bitcell is one of a plurality of MTJ antifuse bitcells of the antifuse circuit, wherein each MTJ antifuse bitcell includes: (a) an MTJ having a plurality of electrodes and a magnetoresistive stack/structure disposed therebetween, wherein the MTJ is configured in only one of (i) a programmed antifuse state which corresponds to the MTJ having a resistance in a first resistance range or (ii) an unprogrammed antifuse state, and wherein if the MTJ is configured in the unprogrammed antifuse state, the MTJ is configurable in an unprogrammed low state which corresponds to the MTJ having a resistance in a second resistance range, wherein the resistances of the second resistance range are greater than the resistances of the first resistance range, and an unprogrammed high state which corresponds to the MTJ having a resistance in a third resistance range wherein a majority of the resistances of the third resistance range are greater than all of the resistances of the first and second resistance ranges, the method of reading the first MTJ antifuse bitcell of the antifuse circuit comprises:
  performing a write operation to write the unprogrammed high state to the MTJ of the first MTJ antifuse bitcell; and
  immediately after performing the writing operation to write the unprogrammed high state to the MTJ of the first MTJ antifuse bitcell, performing a read operation of the first MTJ antifuse bitcell, including sensing a resistance of the MTJ of the first MTJ antifuse bitcell, wherein:
    (i) if the resistance of the MTJ of the first MTJ antifuse bitcell is below a resistance of a lower limit of the third resistance range, the MTJ of the first MTJ antifuse bitcell is in the programmed antifuse state, and
    (ii) if the resistance of the MTJ of the first MTJ antifuse bitcell is greater than the lower limit of the third resistance range, the MTJ of the first MTJ antifuse bitcell is in the unprogrammed antifuse state.

12. A method of claim 11 further including:
  before performing the write operation to write the unprogrammed high state to the MTJ of the first MTJ antifuse bitcell, programming the MTJ of the first MTJ antifuse bitcell into programmed antifuse state wherein, in response, the MTJ breaks down.

13. The method of claim 12, wherein, in response to performing a write operation to write the unprogrammed high state to the MTJ of the first MTJ antifuse bitcell, the resistance of MTJ remains within the first resistance range.

14. The method of claim 12, wherein performing a read operation of the first MTJ antifuse bitcell immediately after performing the writing operation to write the unprogrammed high state to the MTJ of the first MTJ antifuse bitcell, includes sensing the low resistance of the MTJ of the first MTJ antifuse bitcell to determine the first MTJ antifuse bitcell is in the programmed antifuse state.

15. An antifuse circuit, comprising:
  a plurality of magnetoresistive tunnel junction (MTJ) antifuse bitcells including a first MTJ antifuse bitcell and a second MTJ antifuse bitcell, wherein each MTJ antifuse bitcell of the plurality of MTJ antifuse bitcells includes:
    an MTJ having a first electrode and a second electrode and a magnetoresistive stack/structure disposed therebetween, wherein the MTJ is configured in only one of: (i) a programmed antifuse state or (ii) unprogrammed antifuse state, wherein the unprogrammed antifuse state includes an unprogrammed low state and an unprogrammed high state, and
    a first PMOS transistor coupled to the first electrode of the MTJ of the associated MTJ antifuse bitcell, wherein the first PMOS transistor includes a gate;
  a first reference resistor;
  a second reference resistor;
  a plurality of electrical conductors, including:
    a first electrical conductor coupled to the first MTJ antifuse bitcell and second reference resistor, and
    a second electrical conductor coupled to the second MTJ antifuse bitcell and the first reference resistor;
  a sense amplifier having a first input coupled to the first electrical conductor and a second input coupled to the second electrical conductor; and
  wherein, in a first operation, (i) the first PMOS transistor of the first MTJ antifuse bitcell is responsively enabled, via a voltage applied to the gate thereof, to electrically connect the MTJ of the first MTJ antifuse bitcell to the sense amplifier via the first electrical conductor, and wherein the sense amplifier is configured to sense whether the MTJ of the first MTJ antifuse bitcell is in the programmed antifuse state or the unprogrammed antifuse state based on an amount of resistance of the MTJ of the first MTJ antifuse bitcell and an amount of resistance of the first reference resistor.

16. The antifuse circuit of claim 15, wherein:
  the unprogrammed low state of the unprogrammed antifuse state corresponds to the MTJ having a resistance in a second resistance range wherein the resistances of the second resistance range are greater than the resistance of the MTJ when the MTJ is in a programmed antifuse state,
  an unprogrammed high state of the unprogrammed antifuse state corresponds to the MTJ having a resistance in a third resistance range wherein a majority of the resistances of the third resistance range are greater than all of the resistances of the second resistance range, and
  the resistance of the first reference resistor and the resistance of the second reference resistor are each (i) above a resistance of a lower limit of the second resistance range and (ii) below a resistance of a lower limit of the third resistance range.

17. The antifuse circuit of claim 16, further including:
  a second PMOS transistor, electrically connected to the first reference resistor, to responsively and electrically connect the first reference resistor to the second electrical conductor during the first operation.

18. The antifuse circuit of claim 16, further including:
  a second PMOS transistor, electrically connected to the first reference resistor, to responsively and electrically connect the first reference resistor to the second electrical conductor during the first operation, and
  a third PMOS transistor, electrically connected to the second reference resistor, to electrically disconnect the second reference resistor from the first electrical conductor during the first operation.

19. The antifuse circuit of claim 15, further including:
  a second PMOS transistor, electrically connected to the first reference resistor, to (i) electrically connect the first reference resistor to the second electrical conductor during the first operation and (ii) electrically disconnect the second reference resistor from the first electrical conductor during a second operation,
  a third PMOS transistor, electrically connected to the second reference resistor, to (i) electrically disconnect the second reference resistor from the first electrical conductor during the first operation and (ii) electrically connect the second reference resistor from the first electrical conductor during the second operation, and wherein, in the second operation, (i) the first PMOS transistor of the second MTJ antifuse bitcell is responsively enabled, via a voltage applied to the gate thereof, to electrically connect the MTJ of the second MTJ antifuse bitcell to the sense amplifier via the second electrical conductor and (ii) the third PMOS transistor is responsively enabled, via a voltage applied to a gate thereof, to electrically connect the second reference resistor to the sense amplifier via the first electrical conductor, and wherein the sense amplifier, in operation, is configured to sense whether the MTJ of the second MTJ antifuse bitcell is in the programmed antifuse state or the unprogrammed antifuse state.

20. The antifuse circuit of claim 19, wherein:
the unprogrammed low state of the unprogrammed antifuse state corresponds to the MTJ having a resistance in a second resistance range wherein the resistances of the second resistance range are greater than the resistance of the MTJ when the MTJ is in a programmed antifuse state,
an unprogrammed high state of the unprogrammed antifuse state corresponds to the MTJ having a resistance in a third resistance range wherein a majority of the resistances of the third resistance range are greater than all of the resistances of the second resistance range, and
the resistance of the first reference resistor and the resistance of the second reference resistor are each (i) above a resistance of a lower limit of the second resistance range and (ii) below a resistance of a lower limit of the third resistance range.

* * * * *